United States Patent
Levine

(10) Patent No.: US 6,294,414 B1
(45) Date of Patent: Sep. 25, 2001

(54) METHOD OF FABRICATING HETEROINTERFACE DEVICES HAVING DIFFUSED JUNCTIONS

(75) Inventor: Barry Franklin Levine, Livingston, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/564,769

(22) Filed: May 4, 2000

(51) Int. Cl.[7] .................................................. H01L 21/338
(52) U.S. Cl. ............................................ 438/183; 257/623
(58) Field of Search ............................. 438/94, 183, 406, 438/455, 569, 745; 257/623

(56) References Cited

U.S. PATENT DOCUMENTS 4,876,209 * 10/1989 Forrest ...................... 437/5
5,164,813 * 11/1992 Blacstone et al. .............. 257/623
5,654,536 * 8/1997 Suyama et al. ................ 250/207
5,981,400 * 11/1999 Lo .............................. 438/745

OTHER PUBLICATIONS

Chand, Naresh and Houston, P.A., "Diffusion of Cd and Zn IN InP Between 550 and 650° C", Journal of Electronic Materials, vol. 11, No. 1, 1982, pp. 37–53.
Bowers, John E. et al., "High gain–bandwidth–product silicon heterointerface photodetector", *American Institute of Physics* [50003–6951(97)03903–X], 1997.

* cited by examiner

Primary Examiner—David Nelms
Assistant Examiner—David Vu
(74) Attorney, Agent, or Firm—Lowenstein Sandler PC

(57) ABSTRACT

This invention is predicated upon applicants' discovery that the quality of high performance heterointerface devices having diffused junction depends significantly on the rate of cooling after diffusing the junctions. Use of the method to fabricate a high performance photodiode is described.

11 Claims, 2 Drawing Sheets

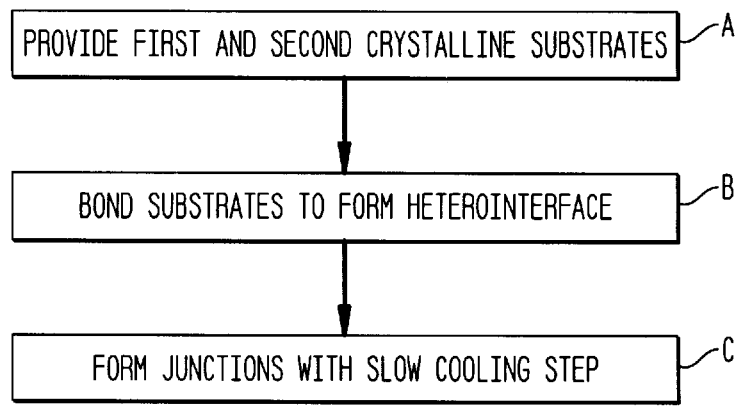
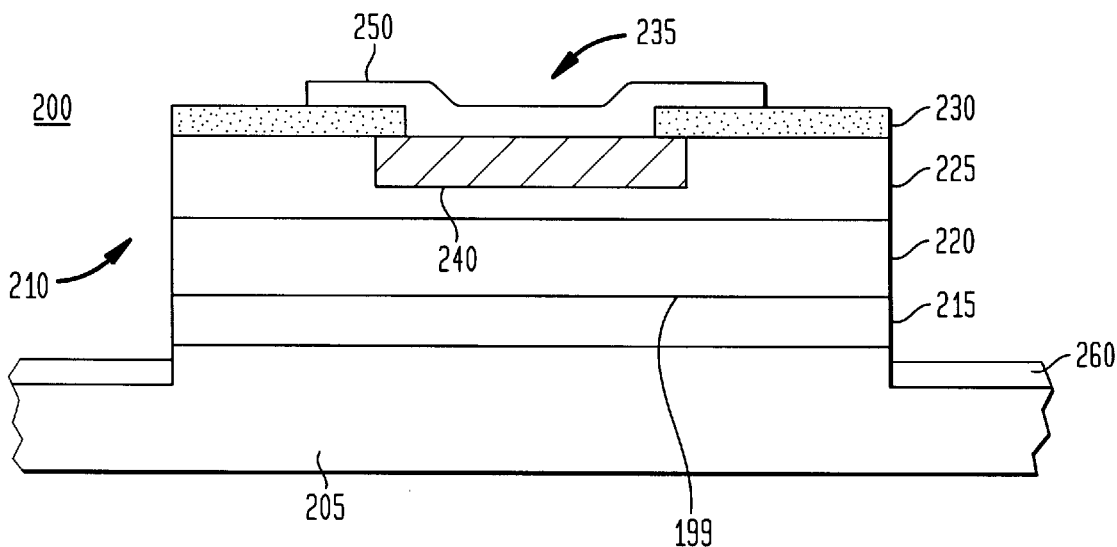

METHOD OF FABRICATING HETEROINTERFACE DEVICES HAVING DIFFUSED JUNCTIONS

FIELD OF THE INVENTION

This invention relates to heterointerface devices and, in particular, to a method of fabricating such devices having one or more a diffused junctions. The method is particularly useful in fabricating photodiodes.

BACKGROUND OF THE INVENTION

Photodiodes are important in many areas of technology. They are essential components of optical communication systems. Such a system essentially comprises a modulated light source coupled to a photodiode by an optical transmission fiber. The diode converts the transmitted optical signal into a corresponding electrical signal.

In optical communication systems it is desirable to have highly sensitive photodiodes. Sensitive photodiodes reduce the number and frequency of repeaters. Sensitive photodiodes are also important in other applications such as time domain reflectometers.

Photodiodes are essentially reverse-biased semiconductor pn junctions. The reverse bias creates an enlarged depletion region between the n region and the p region. Light of appropriate wavelength entering the depletion region generates electron-hole pairs. The electrons and holes are separated by the reverse-bias voltage and produce a current proportioned to the amount of incident light. Photodiodes of different materials are responsive to different wavelengths.

This simple diode structure can be enhanced for greater sensitivity. One improvement is to substantially increase the electrical field across the pn junction. An ordinary photodiode produces but one electron-hole pair for each photon of light absorbed. But if the electrical field is substantially increased, it will impart sufficient energy to the separated electrons and holes that they, upon collision with neutral atoms, will generate additional electron-hole pairs. This process creates an avalanche of charge carriers, increasing the output current. Such diodes are called avalanche photodiodes or APDs.

Several adaptations make APDs more useful in optical communications. Present optical communications systems typically operate at wavelengths in the regions of 1.3 and 1.5 microns. To detect these wavelengths, APDs are commonly made of III–V semiconductors such as indium gallium arsenide and indium phosphide. Such semiconductors have a comparatively small band gap with the consequence that the high fields required for charge carrier multiplication can produce high dark currents due to quantum mechanical tunneling (noise). This problem is alleviated by providing separate absorption and multiplication regions. The carrier pairs are photogenerated in one absorbing region and then swept into a wider bandgap layer containing the pn junction where avalanche multiplication takes place.

An important class of high performance APDs is made from bonded crystalline substrates. Such devices, referred to as heterointerface photodiodes, use one crystalline material as an absorbing region and another crystalline material for multiplication. The carrier pairs are swept through the heterointerface between the two crystals. Such devices are described in A.R. Hawkins et aL., "Silicon heterointerface photodetector," 68 *Appl. Phys. Lett.*, pp. 3692–94 (1996), which is incorporated herein by reference.

The quality of such devices depends in large measure on the quality of the heterointerface between the two bonded crystals. A method of bonding crystals to produce high quality heterointerfaces is described in the copending U.S. patent application Ser. No. 09/369,682 filed by applicant and others on Aug. 5, 1999 and entitled "Method For Bonding Two Crystalline Substrates Together." This application is incorporated herein by reference.

Applicant has further discovered that the quality of the interface and the device also depends on other modifications of conventional processes.

SUMMARY OF THE INVENTION

This invention is predicated upon applicants'discovery that the quality of high performance heterointerface devices having diffused junctions depends significantly on the rate of cooling after diffusing the junctions. Use of the method to fabricate a high performance photodiode is described.

BRIEF DESCRIPTION OF THE DRAWINGS

The advantages, nature and various additional features of the invention will appear more fully upon consideration of the illustrative embodiments now to be described in detail in connection with the accompanying drawings. In the drawings:

FIG. 1 a flow diagram of the steps involved in fabricating a heterointerfade device including one or more diffused junctions;

FIG. 2 is schematic diagram of a heterointerface photodiode made in accordance with the process of FIG. 1.

Figure 3:
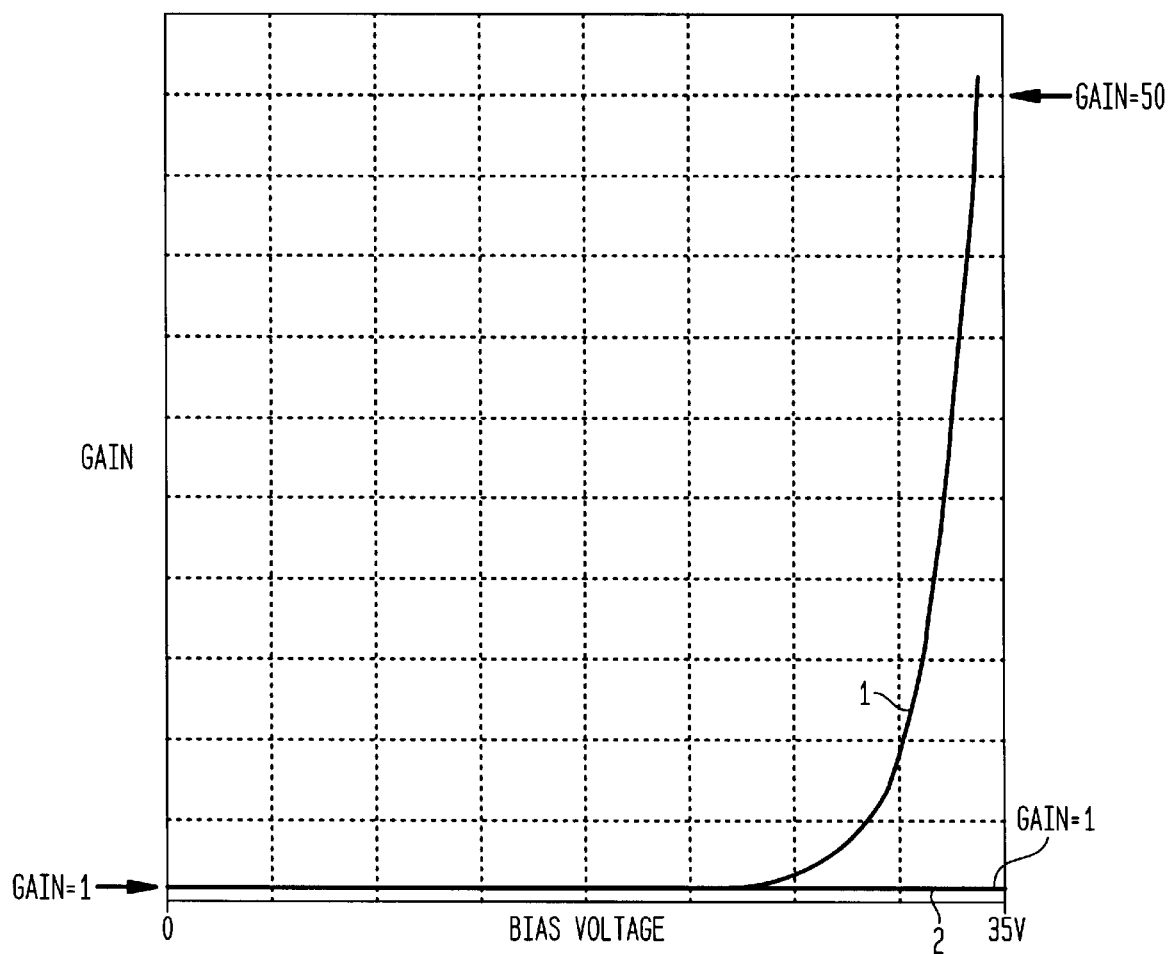
FIG. 3 is a graphical illustration showing the current versus voltage characteristics of a photodiode made in accordance with FIG. 1.

It is to be understood that these drawings are for purposes of illustrating the concepts of the invention and, except for the graphs, are not to scale.

DETAILED DESCRIPTION

Referring to the drawing, FIG. 1 is a schematic flow diagram showing the steps involved in making a heterointerface device in accordance with the invention. The first step, shown in Block A, is to provide two crystalline substrates of different crystal materials, at least one of which is a semiconductor. Usually the materials will have lattice constants that differ by more than 0.1 percent. Typically both crystal materials will be semiconductors, and in a preferred application (photodiodes), one crystal material is silicon and the other is a III-V semiconductor such as InP or InGaAs. Each crystal can be provided with a substantially planar surface for bonding.

The next step, shown in Block B, is to bond the two crystalline substrates together to form a high quality heterointerface between the bonding surfaces. Preferably the bonding is carried out using the method described in the aforementioned co-pending application, Ser. No. 09/369,682. In essence, one or more of the bonding surfaces is etched to provide irregularities through which gas can escape the interface, the surfaces are thoroughly cleaned and they are held together with a small force (1–10 pounds) until Van der Waals forces develop (5–30 minutes). At that point, a portion of one of the substrates can be removed to leave a thin layer at the interface. The remaining bonded structure is then heated to a low temperature (typically less than 100° C.) for a time sufficient to permit entrapped gas to escape through the surface irregularities (10–30 minutes). The structure then is heated to a high temperature, (typically 630–6500° C. for a time sufficient to obtain a strong bond (about 15–30 minutes).

After bonding, as shown in Block C, impurities to form one or more pn junctions can be diffused into the semiconductor substrate. As a preliminary step, a diffusion mask, such as $SiO_2$ can be deposited on an exposed surface, patterned with photoresist and selectively removed in those regions where the junctions are to be formed.

The junctions are typically formed by diffusing a p-type impurity such as zinc through the mask openings into the exposed surface. In order to make a high quality device, cooling after the diffusion step should be slow and gradual. Cooling to room temperature should be gradual over a period exceeding one minute and advantageously exceeding 5 minutes. The preferred period for cooling is at least 10 minutes. The cooling rate should not exceed 20° C. per second and preferably should not exceed about 1° C. per second. As an example, if zinc is to be the dopant, the masked workpiece is placed in an ambient containing a zinc compound such as $Zn(CH_3)_2$, and slowly heated to an elevated temperature of about 550° C., maintained at 550° C. for the desired diffusion time, and slowly cooled to room temperature over about 10 min. The conventional approach of quenching the hot workpiece quickly in water immediately after diffusion does not work and produces inoperative devices.

After formation of the junctions, the device can be completed in the conventional manner. In the case of a photodiode, the finishing process primarily involves forming ohmic contacts in accordance with procedures well known in the art.

FIG. 2 illustrates a typical avalanche photodiode 200 formed by the process of FIG. 1. The photodiode 200 is formed from a substrate 205 of crystalline silicon bonded to substrate 220 of crystalline InGaAs epitaxially grown on crystalline InP 225. A heterointerface 199 is formed between the two substrates. The result of bonding is a patterned stack of materials on an n+silicon surface layer 215 of substrate 205. The patterned stack comprises the layer of n-silicon 215, a layer of n-InGaAs 220, a layer of InP 225, and a layer of $SiO_2$ 230.

The p-contact metal 250 can be gold-berylium alloy, and the n-contact metal 260 can be aluminum. As can be seen, a window 235 was formed in the $SiO_2$ layer 230 and zinc was diffused therein to form the pn junction 240.

The device of FIG. 2 is prepared from a III–V semiconductor substrate bonded to a silicon substrate. A preliminary step involves forming one or more InGaAs and InP layers on an InP substrate. Before the InGaAs layers are formed on the InP substrate an etch stop layer is formed thereon to isolate and protect the InGaAs layers from the etchant used to remove the bulk of the InP substrate during subsequent processing. Suitable materials for such an etch stop are well known in the art.

The InGaAs layers are grown on the InP substrate using conventional CVD techniques. Typically the InGaAs layers have a thickness of about 0.05 $\mu$m to about 5$\mu$m. After the InGaAs layers are formed, the substrate should be maintained below about 550° C. to avoid depleting arsenic from the InGaAs.

In certain embodiments, it is advantageous to pattern one of the two substrate surfaces prior to bonding. The pattern provides an irregular surface that allows gas to escape when the surfaces are pressed together. One example of a suitable pattern is a series of etched lines having a width of about 1 $\mu$m to about 50 $\mu$m and a depth in the range of about 0.1 $\mu$m to about 1 $\mu$m. If the patterned surface is the surface on which the thin layer is grown, the surface is patterned either before or after the thin layer is formed thereon.

Before placing the surface of a silicon substrate in contact with the above-described III–IV substrate, the surfaces of both substrates were cleaned. The silicon surface was cleaned using the following sequence:

1. swabbing the silicon substrate with cotton soaked with isopropyl alcohol to remove dust;
2. boiling the silicon substrate in acetone for five minutes;
3. rinsing the silicon surface in deionized water;
4. repeating steps 2 and 3;
5. boiling the silicon substrate in isopropyl alcohol for five minutes; and
6. rinsing the silicon surface in deionized water.

The silicon substrate was then immersed in a 1:1 solution of $H_2SO_4$:$H_2O_2$ to remove particles from the surface. The surface was subsequently rinsed with deionized water for ten minutes.

The silicon substrate was then cleaned using a standard wafer cleaning process known as RCA1. This process removes resist and particles from the surface. The substrate was boiled (80° C.) in the RCA1 solution (100@ deionized water; 25@ $NH_4OH$; 25 ml $H_2O_2$ in which the $H_2O_2$ was added after the deionized water and the $NH_4OH$ boiled). The substrate was subsequently rinsed in deionized water for 10 minutes.

The substrate was then placed in an aqueous solution of hydrofluoric acid (1 part by volume of 50% HF and 10 parts by volume water) and rinsed in deionized water for ten minutes. The RCA1-rinse cycle was then repeated, and the silicon substrate was blown dry.

The InGaAs surface of the InP substrate was cleaned using the following procedure. First the InGaAs surface was swabbed with cotton soaked with isopropyl alcohol to remove dust. The substrate was then boiled in acetone for five minutes. The substrate was then boiled in a new acetone solution for another five minutes. The substrate was boiled in isopropyl alcohol for five minutes. The InGaAs surface was subjected to UV ozone cleaning for 10 minutes after which the substrate was placed in an aqueous solution of hydrofluoric acid (1 part $H_2O$ to 4 parts HF (10%)). The InGaAs surface was rinsed in DI water for 30 seconds and then blow-dried. The InGaAs surface was subsequently exposed to UV ozone cleaning for another 10 minutes.

Both of the cleaned substrates were placed in a "glove box" (i.e. a container in which the contents inside are capable of being manually manipulated using gloves mounted on the side thereof). The atmosphere inside glove box was evacuated and replaced with nitrogen gas. The InGaAs substrate was then placed in an aqueous solution of hydrofluoric acid for 30 seconds to remove any oxides that had formed on the surface. The InGaAs substrate was rinsed in deionized water and blow-dried (using nitrogen gas). The silicon substrate was subsequently placed in the aqueous solution of HF for 30 seconds, after which the substrate was blow-dried (using nitrogen gas).

The two cleaned wafer surfaces were placed in physical contact with each other. About 1 to 10 lbs. of force was applied to ensure good physical contact. After about 5 to about 30 minutes, the two wafers were removed from the glove box and placed in an HCl etcher to removed the bulk InP portion of the InGaAs substrate.

After the two substrates are cleaned and Van der Waals'bound together, before a portion of one of the substrates is removed, the structure is heated to a low temperature to effect gas escape from the structure. After the portion of the substrate is removed, the structure can be heated again to a low temperature to effect escape of any gas remaining entrapped by the substrates. Conditions suitable for enhancing gas escape (i.e. temperature and duration) are well known to one skilled in the art. For example, water vapor is typical of a substance that may be entrapped on the substrate after the cleaning step. It is desirable to heat the structure to a temperature less than the boiling point of water (100° C.) to enhance gas escape of the water vapor from the structure without forming additional bubbles in the structure that may occur if the structure was heated to the boiling point of water. Exemplary conditions are a temperature in the range of about 30° C. to about 90° C. for about 10 to about 30 minutes. After the low temperature gas removed heating, the structure was then heated in a flowing hydrogen atmosphere to a temperature of about 650° C. for about 15 to 30 minutes. The pn junction 240 was then formed by diffusing zinc into the InGaAs surface as described in connection with FIG. 1.

FIG. 3 is a graphical representation useful in understanding the importance of gradual heating and cooling in the junction diffusion. Curve 1 shows the gain vs. bias voltage for a device where the zinc diffusion was cooled gradually over 10 minutes. As the bias voltage is increased, the photocurrent increases. Gains as large as 50 to 100 can be achieved.

Curve 2 shows the characteristic of a device where the zinc diffusion was quenched in water in the conventional manner. Cooling takes place in substantially less than one minute. As the voltage is increased, the photocurrent remains constant. The device exhibits no gain (a gain of 1).

It is to be understood that the above-described embodiments are illustrative of only a few of the many possible specific embodiments which can represent applications of the principles of the invention. Numerous and varied other arrangements can be readily devised by those skilled in the art without departing from the spirit and scope of the invention.

What is claimed:

1. A method of fabricating a heterointerface device having at least one diffused pn junction comprising the steps of:

providing two different crystalline substrates of different crystal materials, at least one of the substrates being a semiconductor material;

bonding the two crystalline substrates together;

diffusing impurities into the semiconductor substrate at an elevated temperature to form a diffused pn junction; and slowly cooling the diffused junction to room temperature over a period exceeding one minute.

2. A method of fabricating a heterointerface device having at least one diffused pn junction comprising the steps of:

providing two different crystalline substrates, at least one of the substrates being a semiconductor material;

bonding the two crystalline substrates together;

diffusing impurities into the semiconductor substrate at an elevated temperature to form a diffused pn junction; and slowly cooling the diffused junction to room temperature over a period of at least 5 minutes.

3. The method of claim 3 wherein the cooling is over a period of at least 10 minutes.

4. The method of claim 2 where the cooling is no faster than 20° C. per second.

5. The method of claim 2 where the cooling is no faster than 1° C. per second.

6. The method of claim 2 wherein the two different crystalline substrates have lattice constants which differ by more than 0.1 percent.

7. The method of claim 2 wherein one of the crystalline substrates comprises silicon and the other comprises a III–V semiconductor.

8. The method of claim 2 wherein one of the crystalline substrates comprises silicon and the other comprises a layer of crystalline InGaAs epitaxially grown on crystalline InP.

9. The method of claim 2 wherein the step of diffusing impurities comprises diffusing zinc.

10. The method of claim 2 wherein the substrates have respective planar bonding surfaces and including the step of patterning at least one bonding surface prior to bonding to provide an irregular surface that allows gas to escape when the bonding surfaces are pressed together.

11. The method of claim 10 wherein the patterning comprises etching a series of lines having a width in the range 1–50 $\mu$m and a depth in the range 0.1 $\mu$m–1 $\mu$m.

* * * * *